(12) United States Patent
Kimura et al.

(10) Patent No.: US 9,869,724 B2
(45) Date of Patent: Jan. 16, 2018

(54) POWER MANAGEMENT SYSTEM

(71) Applicant: ROHM CO., LTD., Kyoto (JP)

(72) Inventors: Isaku Kimura, Kyoto (JP); Takahiro Shimizu, Kyoto (JP); Yoshiki Kobayashi, Kyoto (JP); Shinya Kobayashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 716 days.

(21) Appl. No.: 14/339,587

(22) Filed: Jul. 24, 2014

(65) Prior Publication Data

US 2015/0032394 A1 Jan. 29, 2015

(30) Foreign Application Priority Data

Jul. 24, 2013 (JP) .................................. 2013-153921
Jul. 24, 2013 (JP) .................................. 2013-153923

(51) Int. Cl.
*G01R 31/36* (2006.01)

(52) U.S. Cl.
CPC ....... *G01R 31/362* (2013.01); *G01R 31/3651* (2013.01); *G01R 31/3662* (2013.01); *G01R 31/3679* (2013.01)

(58) Field of Classification Search
CPC ........... H01M 10/0525; H01M 10/052; H01M 2220/30; H01M 2220/20; H01M 4/525;
(Continued)

(56) References Cited

U.S. PATENT DOCUMENTS

2010/0001693 A1* 1/2010 Iida ..................... G01R 31/3679
320/134
2013/0030739 A1* 1/2013 Takahashi .......... G01R 31/3658
702/63

FOREIGN PATENT DOCUMENTS

JP 05323001 A 12/1993
JP 06059003 A 3/1994
(Continued)

OTHER PUBLICATIONS

JP Office Action corresponding to Application No. 2013-153923; dated Apr. 11, 2017.
(Continued)

*Primary Examiner* — Roy Y Yi
(74) *Attorney, Agent, or Firm* — Cantor Colburn LLP

(57) ABSTRACT

A battery monitoring unit monitors at least one from among: (i) the attachment state of secondary battery pack; (ii) the low state of a battery voltage VBAT; and (iii) the state of whether it is possible or impossible to use the secondary battery. A battery measurement unit measures the battery voltage VBAT, a charge/discharge current IBAT, and a temperature T of the secondary battery pack, and converts the measured values into digital data. A charging circuit is configured to charge the secondary battery pack using DC voltage from an external power supply based on the state information detected by the battery monitoring unit and the information measured by the battery measurement unit. A coulomb counter measures the charge/discharge current IBAT at predetermined time intervals, and integrates the measurement value, thereby calculating the sum total of the charged/discharged amount. The battery management circuit is monolithically integrated on a single semiconductor substrate.

33 Claims, 9 Drawing Sheets

(58) Field of Classification Search
CPC ........... H01M 2004/027; H01M 4/366; H01M 4/505; H01M 4/587; H01M 4/625; H01M 4/131; H01M 4/134; H01M 10/0567; H01M 10/0568; H01M 4/606; H01M 4/621; H01M 4/626; H01M 4/628; H01M 4/662; H01M 4/663; H01M 4/668; H01M 4/74; H01M 4/742; H01M 4/78; H01M 4/808; H01M 8/04522; H01M 8/04544; H01M 8/0662; H01M 8/083
See application file for complete search history.

(56) References Cited

FOREIGN PATENT DOCUMENTS

| | | | |
|---|---|---|---|
| JP | 2003157912 | A | 5/2003 |
| JP | 2006135848 | A | 5/2006 |
| JP | 2007179968 | A | 7/2007 |
| JP | 2009193919 | A | 8/2009 |
| JP | 2010019758 | A | 1/2010 |
| JP | 2010038775 | A | 2/2010 |
| JP | 2010124629 | A | 6/2010 |
| JP | 2011064471 | A | 3/2011 |
| JP | 2011123033 | A | 6/2011 |
| JP | 2012533759 | A | 12/2012 |
| WO | 2011009227 | A1 | 1/2011 |

OTHER PUBLICATIONS

JP Office Action corresponding to Application No. 2013-153921; dated Apr. 11, 2017.

\* cited by examiner

POWER MANAGEMENT SYSTEM

CROSS REFERENCE TO RELATED ART

The present invention claims priority under 35 U.S.C. § 119 to Japanese Application No. 2013-153921 filed Jul. 24, 2013 and Japanese Application No. 2013-15393 filed Jul. 24, 2013, the entire contents of both of which are incorporated herein by reference.

BACKGROUND OF THE INVENTION

1. Field of the Invention

The present invention relates to a power management system including a secondary battery.

2. Description of the Related Art

In various kinds of battery-driven electronic devices such as cellular phone terminals, digital still cameras, tablet terminals, laptop personal computers, etc., electronic circuits such as a CPU (Central Processing Unit) which performs a system control operation and signal processing, a liquid crystal panel, a wireless communication module, other kinds of analog circuits and digital circuits, and the like are each configured to operate receiving power supply from a secondary battery.

For such a battery-driven electronic device, detection of the remaining battery capacity is becoming an indispensable function. As a detection method for detecting the remaining battery capacity, (1) the voltage method and (2) the charge integration method have become mainstream, which will be described below.

With the voltage method, the voltage of the battery (which will also be referred to as the "battery voltage" hereafter) is measured. Subsequently, the remaining capacity is estimated based on the correspondence relation between the voltage and the charge state (SOC; State Of Charge). With the charge integration method, the charge current that flows into the battery and the discharge current that flows from the battery (which will collectively be referred to as the "charge/discharge current" or "load current" hereafter) are respectively integrated so as to calculate the charged charge amount and the discharged charge amount for the battery, on the basis of which the remaining capacity is estimated.

RELATED ART DOCUMENTS

Patent Documents

[Patent Document 1]
PCT Japanese Translation Patent Publication No. 2012-533759
[Patent Document 2]
Japanese Patent Application Laid Open No. 2011-064471
[Patent Document 3]
Japanese Patent Application Laid Open No. 2010-019758
[Patent Document 4]
Japanese Patent Application Laid Open No. H05-323001
[Patent Document 5]
Japanese Patent Application Laid Open No. 2011-123033

With the voltage method, the battery voltage is measured in the battery discharge operation so as to estimate the state of charge (SOC) based on the correspondence relation between the open circuit voltage (OCV) of the battery, which has been measured beforehand, and the state of charge (SOC). On the other hand, the SOC estimated using the charge integration method represents a relative ratio of the present remaining capacity with the battery capacity BATCAP, which is the remaining capacity in a full charge state, as a reference value. The SOC thus estimated is also referred to as the "relative remaining capacity". The absolute remaining capacity cannot be calculated based on the relative remaining capacity SOC estimated using the voltage method.

The voltage of the secondary battery that can be measured via an external circuit is the terminal voltage (which will also be referred to as the "battery voltage") VBAT. That is to say, the battery open circuit voltage OCV must be estimated based on the battery voltage VBAT. Here, the battery voltage VBAT exhibits a voltage value that is lower than that of the OCV. The voltage drop is greatly affected by the operating conditions of the battery, i.e., the waveform of the load current IBAT, the temperature of the battery cell, and the battery aging state.

The cause of the battery voltage being lower than the open circuit voltage is that the internal resistance (equivalent resistance value) of the battery increases depending on the aforementioned operating conditions. As a method for detecting the equivalent resistance value of the battery with high precision, a method is known in which an equivalent circuit model of the battery is assumed, and its impedance elements, i.e., the resistive impedance element, the capacitive impedance element, and the inductive impedance element, are each identified so as to simulate the battery characteristics with high precision. FIGS. 1A and 1B are diagrams each showing an equivalent circuit model of the battery. Zw in FIG. 1A represents an impedance that is caused in the diffusion process, which is also referred to as "Warburg impedance".

With such a method, in a case in which the simulation is performed with high precision, this leads to a complicated equivalent circuit model as shown in FIG. 1A. This leads to an increased amount of calculation for the equivalent resistance value, resulting in an increased calculation processing time and increased power consumption, which is a disadvantage. Conversely, in a case in which a simple equivalent circuit model is employed as shown in FIG. 1B in order to provide a reduced amount of calculation, this leads to a risk of increased estimation error.

In contrast, with the charge integration method, during the actual charge operation and discharge operation, the charged charge amount and the discharged charge amount are integrated. Thus, at the time point at which the battery is completely discharged, the integrated charge amount is defined as zero. Subsequently, the charged charge amount is integrated during the charge operation. The battery is charged until the battery voltage reaches the full charge state voltage. The integrated charge value at this time point can be regarded as the full charge state capacity. In the subsequent discharge operation, by subtracting the discharged charge amount from the full charge state capacity, such an arrangement provides the absolute remaining charge capacity with high precision.

However, in the operation of an actual electronic device, such an electronic device must stop the operation of a peripheral circuit and store necessary information and data in a nonvolatile storage medium before the system is shut down. Thus, such an electronic device requires sufficient remaining electric power to execute such operations. Thus, with such a device, it is difficult for the battery to be in the full discharge state. Furthermore, even in a case in which a battery is mounted in an unknown charge state on the electronic device, the relative value of the integrated charge value is calculated with high precision. However, in this case, the absolute value cannot be calculated.

FIG. 2 is a block diagram showing a power management system 101r according to a comparison technique investigated by the present inventors. It should be noted that the power management system 101r shown in FIG. 2 is by no means regarded as a conventional technique. The power management system 101r includes a charging circuit 302r, a battery monitoring unit 304r, a battery measurement unit 306r, and a coulomb counter 308r, in the form of two or more separate ICs (Integrated Circuits) or otherwise modules.

The charging circuit 302r receives the DC voltage VEXT from an external power supply adapter, and charges a secondary battery pack 200. The charging circuit 302r is configured to be capable of switching the charging mode between a constant current charging mode and a constant voltage charging mode, for example. In the constant current charging mode, the charging circuit 302r detects the battery current IBAT, and controls the charge state such that the current detection value approaches a target value. On the other hand, in the constant voltage charging mode, the charging circuit 302r detects the battery voltage, and performs a feedback control operation for the charge state such that the detection value of the battery voltage approaches a target value. Furthermore, the charging circuit 302r includes a voltage comparator which compares the battery voltage with a threshold value so as to detect the full charge state, a voltage comparator configured to detect the external DC voltage VEXT, and the like. Moreover, in order to perform a control operation for the charging current, the charging circuit 302r has a function of measuring the temperature of the battery.

The battery monitoring unit 304r performs: (i) detection of attachment or detachment when a secondary battery pack 200 has been mounted; (ii) detection of whether or not the battery voltage VBAT, which is the output of the battery cell 202, is excessively low; (iii) detection of whether or not the battery cell 202 will operate normally (dead battery detection), and the like.

The battery measurement unit 306r measures the output voltage VBAT of the battery cell 202, the charge/discharge current IBAT for the battery cell 202, and the temperature T of the battery cell 202, and converts the measurement values into digital data.

The coulomb counter 308r measures the charge/discharge current IBAT for the battery at regular time intervals (every one second or several seconds), and calculates the present charge amount or otherwise the discharge amount by multiplying the charge/discharge current IBAT by the time interval. Furthermore, the coulomb counter 308r integrates the charge amount or otherwise the discharge amount thus calculated, thereby calculating the sum total of the charge amount or discharge amount.

1. It is known that the repetition of charge/discharge cycles leads to aging of the secondary battery pack 200. Thus, there is a demand for such a power management system 101r shown in FIG. 2 configured to estimate the aging degree (aging level) of the secondary battery pack 200.

2. Furthermore, there is a demand for a power management system 101r shown in FIG. 2 which requires only a small amount of calculation to measure the remaining capacity of the secondary battery pack 200 with high precision.

SUMMARY OF THE INVENTION

1. An embodiment of the present invention provides a power management system which is capable of evaluating the aging of a secondary battery.

A power management system according to an embodiment of the present invention comprises: a secondary battery pack; a battery measurement unit configured to measure a battery voltage VBAT of the secondary battery pack and a charge/discharge current IBAT; an initial resistance calculation unit configured to calculate an initial value of the internal resistance of the secondary battery pack; and an aging evaluation unit configured to estimate an aging degree of the secondary battery pack. The battery measurement unit is configured such that when the secondary battery pack is detected, a battery voltage VBAT1 is measured in a state in which no load is connected to the secondary battery pack, and a battery voltage VBAT0 and a load current IBAT0 are measured in a state in which a dummy load is connected to the secondary battery pack. The initial resistance calculation unit is configured to calculate an initial value ZBAT_init of the internal resistance of the secondary battery pack based on the Expression ZBAT_init=(VBAT1−VBAT0)/IBAT0 using the battery voltage VBAT and the charge/discharge current IBAT. The aging evaluation unit is configured to hold a reference value ZBAT_pre of the internal resistance acquired beforehand for the secondary battery pack before it ages, and to estimate an aging degree of the secondary battery pack based on a relation between the initial value ZBAT_init and the reference value ZBAT_pre.

The repetition of the charging/discharging of the secondary battery leads to an increase in the internal resistance of the secondary battery. After the secondary battery is detected, the initial value of the internal resistance of the secondary battery can be calculated based on the initial measurement values of the battery current and battery voltage before the secondary battery is used. The present inventors have found that there is a correspondence between the initial value and the aging degree. Such an embodiment allows the aging degree of the secondary battery pack to be evaluated based on the relation between the initial value of the internal resistance and a reference value of the internal resistance that has been measured before the secondary battery ages.

Also, in a case in which the internal resistance value has temperature dependence, a temperature dependent term may be removed for each of the initial value ZBAT_init and the reference value ZBAT_pre.

Also, the aging evaluation unit may be configured to calculate the aging degree α based on α=(ZBAT_init−ZBAT_pre)/ZBAT_pre.

The power management system according to an embodiment may further comprise a battery capacity correction unit configured to correct a battery capacity BATCAP of the secondary battery pack based on the aging degree.

Also, the battery capacity correction unit may be configured to multiply the battery capacity BATCAP by (1−α).

Another embodiment of the present invention relates to an electronic device. The electronic device may comprise the aforementioned power management system.

2. Another embodiment of the present invention provides a power management system which requires only a small amount of calculation as compared with conventional techniques, to detect the remaining capacity of a secondary battery without a reduction in the precision as a tradeoff disadvantage.

A power management system comprises: a battery measurement unit configured to measure a battery voltage VBAT of a secondary battery pack, a charge/discharge current IBAT, and a temperature T; and a remaining capacity detection unit configured to calculate the remaining capacity of the secondary battery pack based on the battery voltage VBAT, the charge/discharge current IBAT, and the temperature T. An internal resistance RINT of the secondary battery pack is modeled assuming that the internal resistance RINT is represented by the sum of a fixed component RF and a variable component RV. The remaining capacity detection unit comprises: an internal resistance calculation unit configured to calculate the internal resistance RINT; a voltage drop calculation unit configured to calculate a voltage drop VDROP by multiplying the internal resistance RINT by the charge/discharge current IBAT; an open circuit voltage calculation unit configured to calculate an open circuit voltage OCV of the second battery pack by adding the present battery voltage VBAT to the voltage drop VDROP; and a first charge state estimation unit configured to acquire a present state of charge SOC_ocv that corresponds to the present open circuit voltage OCV based on a correspondence relation between a state of charge SOC which indicates a relative remaining capacity of the second battery pack with respect to a full-charge state of the secondary battery pack and the open circuit voltage OCV of the secondary battery pack.

With such an embodiment, by modeling the internal resistance of the secondary battery as a series connection of a fixed component and a variable component, such an arrangement requires only a small amount of calculation as compared with conventional techniques, to detect the remaining capacity of a secondary battery without a reduction in the precision as a tradeoff disadvantage.

Also, the variable component RV comprises a temperature dependent component $R_T$ and a transient response component $R_I$ of the charge/discharge current. Also, the transient response component $R_I$ at a given time point may be defined assuming that it has a value that corresponds to an effect level calculated by a history of the charge/discharge current IBAT that has already flowed.

Also, the effect level may be defined as a value calculated by a weighted calculation of the charge/discharge current IBAT measured in the past from the given time point over a predetermined period of time.

Also, the power management system according to an embodiment may further comprise a coulomb counter configured to integrate the charge/discharge current at predetermined time intervals. Also, the effect level may be defined as a function with the coulomb counter count value as an argument.

Also, the effect level CCNTS_var(n) at a discrete n-th time point may be calculated using CCNTS_var(n)=$\Sigma_{p=0:m}$[{CCNT(n−p)−CCNT(n−p−1)}*K_dec (p)], where CCNT represents the coulomb counter count value, K_dec represents a decay coefficient due to the passage of time, m represents the number of past samples to be used to calculate the effect level of the history, and (n−p) represents a time point p time points before the present time point n.

Also, the decay coefficient K_dec(p) may be defined as an exponential decay K_dec(p)=$2^{-p}$, using an exponent of 2. This allows the calculation processing to be dramatically simplified.

Also, the remaining capacity detection unit according to an embodiment may further comprise a second charge state estimation unit configured to calculate the state of charge SOC_cc(n) according to SOC_cc(n)=CCNT(n)/BATCAP, with the coulomb counter count value as CCNT(n), and with the battery capacity as BATCAP. Such an embodiment allows error correction to be performed based on the states of charge obtained using two methods.

The remaining capacity detection unit according to an embodiment may further comprise a coulomb counter correction unit configured to correct the coulomb counter count value when the difference between the two states of charge SOC_ocv and SOC_cc is greater than an allowable value.

Also, when a relative difference between the two states of charge SOC_ocv and SOC_cc is greater than a predetermined threshold value, the coulomb counter correction unit may multiply the coulomb counter count value by a predetermined coefficient.

The remaining capacity detection unit according to an embodiment may further comprise a battery capacity correction unit configured to correct the battery capacity BATCAP when a difference between the two states of charge SOC_ocv and SOC_cc is greater than an allowable value.

Also, when a relative difference between the two states of charge SOC_ocv and SOC_cc is greater than a predetermined threshold value, the battery capacity correction unit may multiply the battery capacity BATCAP by a predetermined coefficient.

Yet another embodiment of the present invention relates to an electronic device. The electronic device may comprise the aforementioned power management system.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

In the present specification, the reference symbols denoting a voltage signal, current signal, or resistor, also represent the corresponding voltage value, current value, or resistance value.

[System Configuration]

Figure 3:
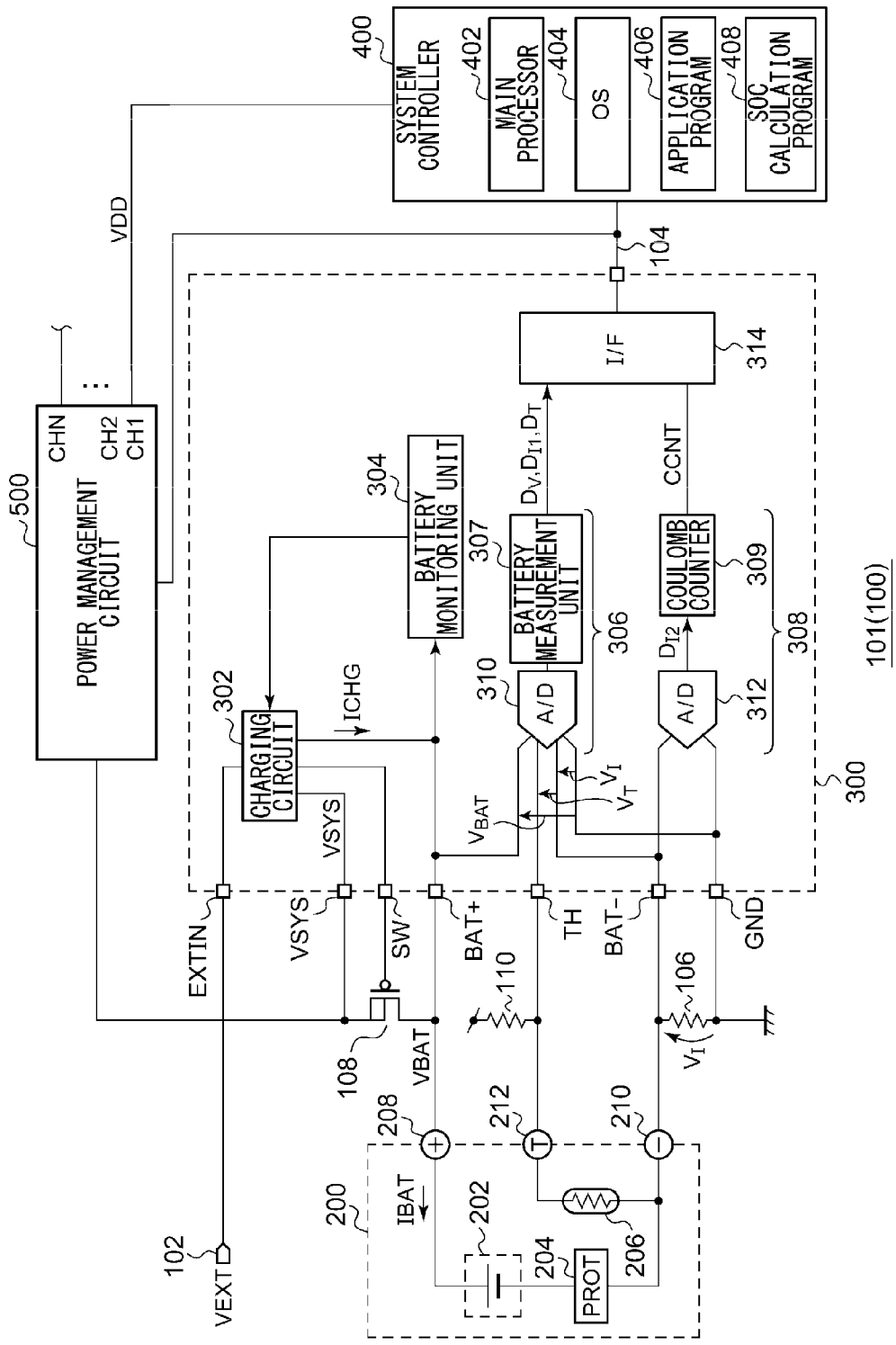
FIG. 3 is a block diagram showing an electronic device including a power management system according to an embodiment.

FIG. 3 is a block diagram showing an electronic device including a power management system 101 according to an embodiment.

The electronic device 100 is configured as a battery-driven device, and includes a battery management circuit 300, a system controller 400, and a power management circuit 500, in addition to a secondary battery pack 200. The overall system comprising the secondary battery pack 200, the battery management circuit 300, the system controller 400, and the power management circuit 500, which is configured to perform the power control operation for the electronic device 100, will be referred to as the power management system 101.

The secondary battery pack 200 is configured as a lithium-ion battery, for example. The secondary battery pack 200 includes a battery cell (electric cell) 202, a protection circuit 204, and a thermistor 206. The secondary battery pack 200 further includes a positive electrode terminal 208 and a negative electrode terminal 210, which allow the output power of the battery cell 202 to be output to an external circuit.

One end of the thermistor 206 is connected to the negative electrode terminal 210 of the battery cell. The other end of the thermistor 206 is connected to a temperature detection terminal 212. Such an arrangement in which the thermistor 206 is built into the secondary battery pack 200 has been described for exemplary purposes only. Also, in order to measure the temperature of the battery cell 202, a thermistor or other kinds of temperature sensors may be provided on a battery holder side of the device such that such a temperature sensor is in contact with the battery pack.

The system controller 400 integrally controls the overall operation of the electronic device 100. The system controller 400 mainly comprises: a hardware component configured as a main processor 402; and a software component configured as an operating system 404, an application program 406, and a remaining capacity calculation program 408, which are configured to operate in a cooperative manner.

The system controller 400 performs a system control operation, system management operation, and peripheral circuit control operation under the operating system 404, which operates on the main processor 402. Furthermore, the system controller 400 executes the application program 406 and the remaining capacity calculation program 408 for estimating the remaining battery capacity.

Furthermore, the main processor 402 is capable of communicating with the battery management circuit 300 and the power management circuit 500 via a communication bus 104. Such an arrangement allows the main processor 402 to receive information from the battery management circuit 300 and the power management circuit 500, and to monitor and control the battery state and the power supply state.

An unshown external power supply (which will also be referred to as the "power supply adapter") can be detachably connected to a DC power input terminal 102. When the external power supply is connected to the DC power input terminal 102, the external DC voltage VEXT is supplied to the DC power input terminal 102.

The power management circuit 500 receives a system voltage VSYS, and supplies the power supply voltage to the main processor 402, which is a component of the system controller 400, and other peripheral circuits. The system voltage VSYS may be configured as the battery voltage VBAT supplied from the secondary battery pack 200 or otherwise the DC voltage VEXT received from an external power supply after it is stabilized by the battery management circuit 300.

The power management circuit 500 includes one or multiple channels CH1 through CHN of power supply circuits. The power supply circuit of each channel is provided to a respective load. The power supply circuit of each channel stabilizes the system voltage VSYS to a predetermined level, and supplies the DC power supply voltage thus stabilized to the corresponding load. For example, the power supply circuit of the first channel CH1 supplies the power supply voltage VDD to the system controller 400. The power supply circuit of a different channel supplies the power supply voltage to an unshown liquid crystal driver. The power supply circuit may be configured as a linear regulator, DC/DC converter, charge pump circuit, or the like.

The power management circuit 500 performs a management operation for the start/stop timing of the voltage output from each of the multiple channels CH1 through CHN, and a power supply management operation.

The battery management circuit 300 mainly performs a management operation for the secondary battery pack 200, and more specifically, charges the secondary battery pack 200 and detects the charge state.

The battery management circuit 300 includes a charging circuit 302, a battery monitoring unit 304, a battery measurement unit 306, and a coulomb counter 308. Furthermore, the battery management circuit 300 includes an external input (EXTIN) terminal, a switch (SW) terminal, a system voltage (VSYS) terminal, a positive electrode connection (BAT+) terminal, a negative electrode connection (BAT−) terminal, a thermistor (TH) terminal, and a ground (GND) terminal.

The EXTIN terminal is connected to the DC power input terminal 102. The BAT+ terminal and the BAT− terminal are connected to the positive electrode terminal 208 and the negative electrode terminal 210, respectively, of the secondary battery pack 200. The TH terminal is connected to the temperature detection terminal 212 of the secondary battery pack 200. The GND terminal is grounded.

The charging circuit 302 is connected to the EXTIN terminal, the BAT+ terminal, the VSYS terminal, and the SW terminal.

When the external DC voltage VEXT having an effective voltage level is supplied to the DC power input terminal 102, the charging circuit 302 stabilizes the voltage thus received so as to generate the system voltage VSYS. The charging circuit 302 supplies the system voltage VSYS thus generated to the power management circuit 500 via the VSYS terminal. When the remaining capacity of the battery cell 202 has decreased, the charging circuit 302 supplies the charging current ICHG to the battery cell 202 via the BAT+ terminal, thereby charging the secondary battery pack 200.

The charging circuit 302 is configured to be capable of switching between a constant current (CC) mode in which the charging current ICHG is stabilized to a constant value, and a constant voltage (CV) mode in which the battery voltage VBAT is stabilized to a constant value. The charging circuit 302 may be configured as a linear power supply or a switching power supply. The configuration of the charging circuit 302 is not restricted in particular.

A power FET 108 is arranged on a path from the positive electrode terminal 208 of the secondary battery pack 200 to the power management circuit 500. The gate of the power FET 108 is connected to the switch terminal SW of the battery management circuit 300. The charging circuit 302 controls the on/off switching of the power FET 108 so as to switch the power management circuit 500 between a state in which it operates using the battery voltage VBAT and a state in which it operates using the system voltage VSYS.

In the operation of the system controller 400 receiving the system voltage VSYS stabilized by the charging circuit 302, in some cases, the power consumption of the system controller 400 becomes large, and exceeds the capacity of the external power supply. In some cases, this leads to a drop in the external DC voltage VEXT, resulting in an insufficiency in the electric power supplied to the system controller 400. In order to solve such a problem, when the external DC voltage VEXT is low, the charging of the battery cell 202 is suspended, and the power MOSFET (Metal Oxide Semiconductor Field Effect Transistor) 108 is switched to the full-on state so as to support the power supply to the system controller 400 by means of the battery cell 202.

The battery monitoring unit 304 performs: (i) detection of attachment or detachment when a secondary battery pack 200 has been mounted; (ii) detection of whether or not the battery voltage VBAT, which is the output of the battery cell 200, is excessively low; (iii) detection of whether or not the battery cell 202 will operate normally (dead battery detection), and the like. The battery monitoring unit 304 transmits the information with respect to the state of the battery cell 202 thus detected to the charging circuit 302. The charging circuit 302 controls the charging operation based on the information with respect to the state of the battery cell 202 thus received.

A first A/D converter 310 receives the respective voltages at the BAT+ terminal, the BAT− terminal, the TH terminal, and the GND terminal. The battery measurement unit 306 uses the first A/D converter 310 to measure the output voltage VBAT of the battery cell 202, the charge/discharge current IBAT for the battery cell 202 (which will also be referred to simply as the "charge/discharge current" hereafter), and the temperature T of the battery cell 202, and to convert the measured values into digital data.

The first A/D converter 310 receives the battery voltage VBAT across the BAT+ terminal and the BAT− terminal, and converts the battery voltage VBAT into a digital value. The battery measurement unit 306 acquires the digital value as a battery voltage value $D_V$ which represents the battery voltage VBAT.

A current detection resistor 106 is arranged in series with the battery cell 202 on a current path of the charge/discharge current IBAT for the battery cell 202. With the present embodiment, the current detection resistor 106 is arranged between the negative electrode terminal 210 and the ground line. However, the position at which the current detection resistor 106 is arranged is not restricted in particular. For example, the current detection resistor 106 may be arranged between the positive electrode 208 and the power FET 108.

The charge/discharge current IBAT of the battery cell 202 flows through the current detection resistor 106. As a result, a voltage drop (which will be referred to as the "current detection voltage") $V_I$ occurs across both ends of the current detection resistor 106 in proportion to the charge/discharge current IBAT. A second A/D converter 312 converts the current detection voltage $V_I$ across the BAT-terminal and the GND terminal into a digital value.

The resistance value of the current detection resistor 106 is known. Thus, a digital calculation unit 307 of the battery measurement unit 306 generates a current detection value $D_{I1}$ which indicates the charge/discharge current IBAT, based on the digital value that corresponds to the current detection voltage $V_I$ and the resistance value of the current detection resistor 106. The absolute value of the current detection value $D_{I1}$ represents the amount of charge/discharge current IBAT, and the sign of the current detection value $D_{I1}$ represents the direction of the charge/discharge current IBAT.

The temperature detection terminal 212 of the secondary battery pack 200 is pulled up to a constant voltage via an external resistor 110. With such an arrangement, a current flows through the thermistor 206 built into the secondary battery pack 200 via the resistor 110. Thus, a temperature detection voltage $V_T$ occurs across both ends of the thermistor 206, i.e., across the temperature detection terminal 212 and the negative electrode terminal 210, according to the resistance value of the thermistor 206. The resistance value of the thermistor 206 changes according to a change in the temperature of the battery cell 202. Thus, there is a one-to-one correspondence between the temperature detection voltage $V_T$ and the temperature of the battery cell 202. The first A/D converter 310 converts the temperature detection voltage $V_T$ across the TH terminal and the BAT-terminal into a digital value. The digital calculation unit 307 of the battery monitoring unit 304 converts the digital value that corresponds to the temperature detection voltage $V_T$ into a temperature value $D_T$ which indicates the temperature of the battery cell 202.

The first A/D converter 310 may be configured to measure the battery voltage VBAT, the current detection voltage $V_T$, and the temperature detection voltage $V_T$, in a time sharing manner. That is to say, such a single A/D converter may be shared by the three voltages in a time sharing manner. Also, in order to reduce the power loss, the current detection resistor 106 is preferably configured to have as small a voltage as possible. With such an arrangement, when the charge/discharge current IBAT is small, the current detection voltage $V_I$ that develops across both ends of the current detection resistor 106 exhibits a very small value. Thus, as an upstream stage of the first A/D converter 310, an amplifier may be arranged so as to amplify the current detection voltage $V_I$.

The measurement values measured by the battery measurement unit 306, i.e., the output voltage value $D_V$ of the battery cell, the charge/discharge current value $D_I$, and the temperature value $D_T$ of the battery cell, are output to the charging circuit 302, and are used in the charging control operation. At the same time, in order to detect the state of charge (SOC) of the battery cell 202, the aforementioned measurement values are read out by the system controller 400 (remaining capacity calculation program 408) via an interface unit 314 and the communication bus 104. The measurement values thus read out are used in the calculation processing.

The second A/D converter 312 converts the current detection voltage $V_I$ that occurs across both ends of the current detection resistor 106 into a digital value, in the same way as with the first A/D converter 310. The coulomb counter 308 measures the charge/discharge current IBAT of the battery at regular time intervals (every one second or several seconds) using the output value of the second A/D converter 312. Furthermore, the coulomb counter 308 calculates the present charge amount or otherwise the discharge amount by multiplying the charge/discharge current IBAT by the time interval. Moreover, the coulomb counter 308 integrates the charge amount or otherwise the discharge amount thus calculated, thereby calculating the sum total of the charged charge amount or discharged charge amount. This processing may be executed by a digital calculation unit 309.

Even when the system is in a suspended state, a very small amount of discharging current flows from the battery cell 202, leading to a change in the remaining battery capacity. Thus, in order to detect the remaining battery capacity with high precision, there is a need to detect such a very small amount of charge/discharge current. In order to meet this requirement, the second A/D converter 312, which is employed in the coulomb counter 308, is preferably configured to have a higher resolution than that of the first A/D converter 310 employed in the aforementioned battery measurement unit 306, so as to detect such a very small amount of discharged charge that changes when the is in the suspended state, i.e., a very small amount of charge/discharge current IBAT.

The value (which will be referred to as the "charge count value CCNT") calculated by the coulomb counter 308 is read out by the system controller 400 (remaining capacity calculation program 408), and is used to detect the remaining battery capacity, in the same way as the aforementioned measurement values of the battery. In a case in which a battery pack is mounted in an unknown charge state on the electronic device, the battery measurement unit 306 executes an initial measurement operation. After the system is started up, the system controller 400 reads out the initial measurement value, and the value stored in the coulomb counter is set to the initial value.

The system controller 400 estimates the remaining battery capacity of the battery cell 202 based on the information with respect to the secondary battery pack 200 acquired by the battery management circuit 300. Description will be made later regarding calculation processing by means of the system controller 400.

The above is the configuration of the power management system 101 according to the embodiment.

Next, description will be made regarding the advantages of the power management system 101. The advantages of the power management system 101 can be clearly understood in comparison with the power management system 101r shown in FIG. 2.

With the power management system 101 shown in FIG. 3 according to the embodiment, such an arrangement allows the charging circuit 302 and an apparatus configured to measure the state of the battery, i.e., the battery monitoring unit 304, the battery measurement unit 306, and the coulomb counter 308, to be monolithically configured in the battery management circuit 300. Such an arrangement allows hardware resources such as A/D converters, amplifiers, resistors, comparators, etc., to be shared between the circuit components included in the battery management circuit 300. This allows redundant function blocks to be omitted.

Next, description will be made regarding the calculation processing for the remaining battery capacity by means of the battery management circuit 300 and the system controller 400.

[Model of Secondary Battery]

First, description will be made regarding a model of the secondary battery which can be employed in the estimation calculation.

Figure 4A:
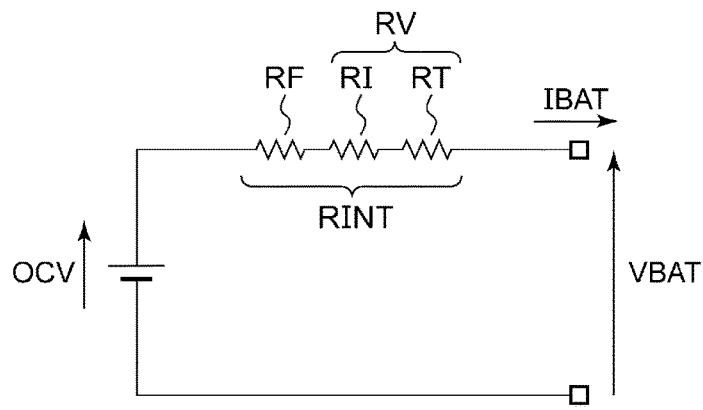
FIG. 4A is a diagram showing an equivalent circuit model of the secondary battery pack.
Figure 4B:
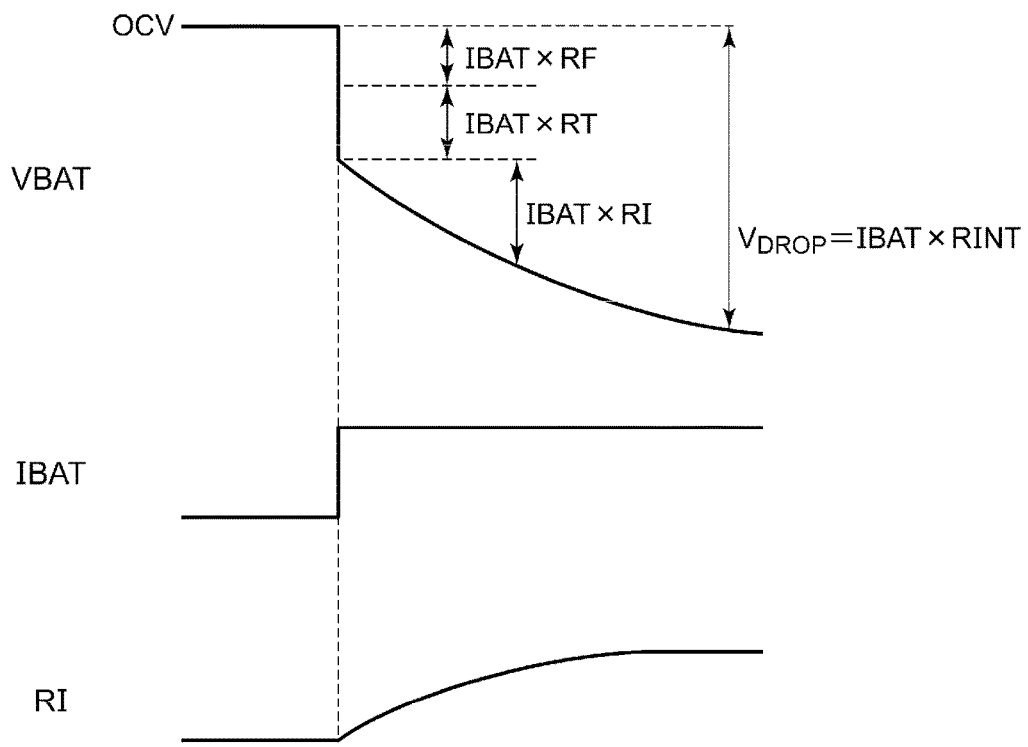
FIG. 4B is a waveform diagram showing the battery voltage and the load current.

FIG. 4A is a circuit diagram showing an equivalent circuit model of the secondary battery. FIG. 4B is a waveform diagram showing the battery voltage and the load currents.

As shown in FIG. 4A, with the present embodiment, the internal resistance RINT is defined as the sum of a fixed component RF and a variable component RV, as represented by RINT=RF+RV.

The fixed component RF comprises a fixed resistance component of the battery itself which is independent of the operating conditions of the battery, i.e., a contact resistance between an electrode active material and a collector body, an electric resistance of the electrode metal member, and the like. On the other hand, the variable component RV comprises a variable resistance component which depends on the operating conditions of the battery, i.e., the change in the battery temperature, fluctuation in the load current, and change in the state of charge (SOC).

More specifically, the variable component RV is defined as the sum of a variable component (transient response component) RI based on the transient response of the current that flows through the battery and a variable component (temperature dependent component RT) that depends on the temperature T, as represented by the following Expression.

$$RV=RI+RT$$

It should be noted that the equivalent circuit model should by no means be recognized as a known technique. Rather, this equivalent circuit model has been uniquely proposed by the present inventors.

Referring to FIG. 4B, let us consider a case in which, before a given time point t0, the load current (discharge current) IBAT is zero. Here, description will be made assuming that the battery voltage VBAT is equal to the open circuit voltage OCV before the time point t0.

Immediately after the load current IBAT rises at the time point t0, the battery voltage VBAT drops. The amount of voltage drop VDROP is represented by the sum of a voltage drop represented by IBAT×RF with the fixed resistance component as RF, and a voltage drop represented by IBAT×RT with the temperature independence component as RT.

Immediately after the load current IBAT starts to flow, the transient response component RI is zero. However, when the load current IBAT continues to flow, the transient response component RI changes according to the history of the current that has already flowed in the past. An increase in the transient response component RI leads to an increase in the voltage drop IBAT×RI across both ends of the battery. Thus, the battery voltage VBAT further drops with time. The dependence of the battery voltage on past load current depends not only on the current that flows at a single time point. Rather, the effect of the past load current on the battery voltage remains from several minutes or several tens of minutes before. Thus, the transient response component RI can be estimated with high precision by performing the calculation, giving consideration to the history of variation in the current during a period of time from several minutes before in which the current variation history has a particularly great effect on the transient response component RI.

In a case in which the battery voltage VBAT is a known value at a given time point, the open circuit voltage OCV can be estimated using the following Expression.

$$OCV = VBAT + IBAT * RINT = VBAT + IBAT \times (RF + RI + RT)$$

The fixed component RF can be acquired in the initial measurement step S102 described later. Alternatively, a value acquired beforehand with respect to a sample of the secondary battery may be used. Here, the value of the fixed component RF acquired beforehand will be represented by ZBAT1_pre, and the value acquired in the initial measurement step S102 will be represented by ZBAT1_init.

With regard to the temperature dependent component RT, the relation between the temperature T and the temperature dependent component RT is acquired beforehand by experiment or otherwise simulation using a sample of the secondary battery. A table or otherwise a relation expression (function) which is associated with the relation between the temperature T and the temperature dependent component RT is stored in the remaining capacity calculation program 408. The temperature dependent component RT calculated using this table or otherwise this relation expression will be represented by ZBAT2_pre(T).

As shown in FIG. 4B, it can be assumed that the transient response component RV at a given time point has a value that corresponds to the history of the load current IBAT that has flowed in the past. Thus, with the present embodiment, a value CCNTS_var is defined, which is calculated based on the current IBAT that flows during a predetermined period of time from a given time point. The CCNTS_var value is configured as a parameter which represents the level of the effect of the past load variation, which will also be referred to simply as the "effect level" hereafter).

The relation between the effect level CCNTS_var and the transient response component RV is acquired beforehand by experiment or otherwise simulation. A table or otherwise a relation expression (function) which is associated with the relation thus acquired is stored in the remaining capacity calculation program 408. The transient response component RI calculated using this table or this relation expression will be represented by ZBAT3_pre(CCNTS_var).

As an example, the CCNTS_var value may be calculated by weighted integration of the value CCNT acquired by the coulomb counter in the past over a predetermined period of time (e.g., several seconds to several tens of seconds). Detailed description will be made regarding the effect level CCNTS_var.

Figure 5:
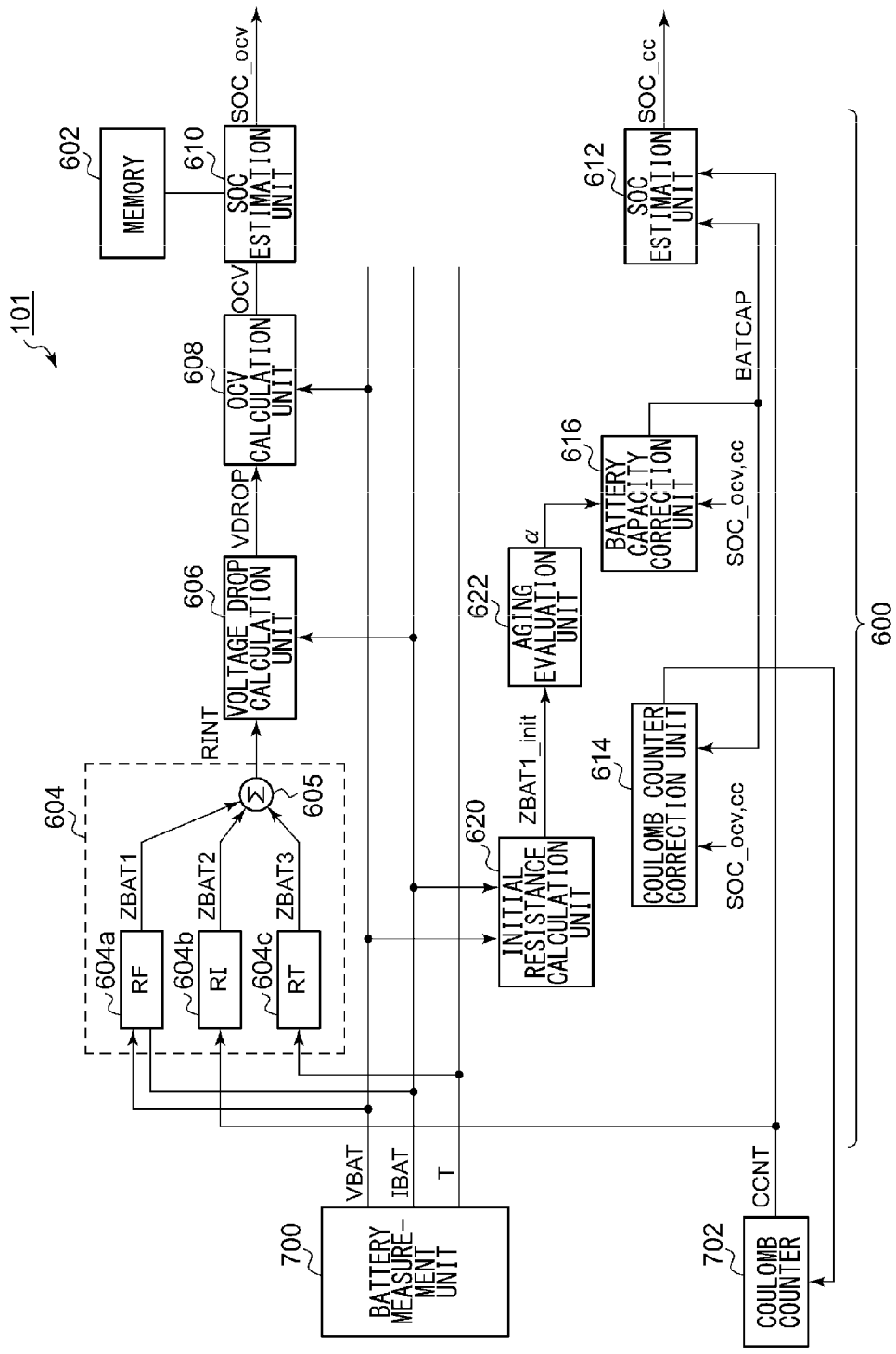
FIG. 5 is a functional block diagram showing a detection operation of the power management system for detecting the remaining battery capacity according to the embodiment.

FIG. 5 is a functional block diagram showing the remaining battery capacity detecting operation of the power management system 101 according to the embodiment. The power management system 101 includes a battery measurement unit 700, a coulomb counter 702, and a remaining capacity detection unit 600.

The battery measurement unit 700 corresponds to the battery measurement unit 306 shown in FIG. 3, and measures the battery voltage VBAT of the secondary battery pack 200, the charge/discharge current IBAT, and the temperature T. The coulomb counter 702 corresponds to the coulomb counter 308 shown in FIG. 3, and integrates the charge/discharge current IBAT for every predetermined time internal.

The remaining capacity detection unit 600 corresponds to a part of the system controller 400 shown in FIG. 3. Specifically, the remaining capacity detection unit 600 is configured as a combination of the main processor 402 and the software component. The remaining capacity detection unit 600 calculates the remaining capacity of the secondary battery pack 200, and more specifically, the absolute remaining capacity and the relative remaining capacity, based on the battery voltage VBAT, the charge/discharge current IBAT, and the temperature T.

The remaining capacity detection unit 600 includes memory 602, an internal resistance calculation unit 604, a voltage drop calculation unit 606, an open circuit voltage calculation unit 608, a first charge state estimation unit 610, a second charge state estimation unit 612, a coulomb counter correction unit 614, a battery capacity correction unit 616, an initial resistance calculation unit 620, and an aging evaluation unit 622.

The memory 602 holds a table or otherwise a function which defines the correspondence relation between the open circuit voltage OCV of the secondary battery pack 200 and the charge state (relative remaining capacity) SOC_ocv which represents the relative remaining capacity of the secondary battery pack 200 with respect to the battery capacity BATCAP in the full-charge state. As described above, this correspondence relation is acquired beforehand.

As described above, a model is assumed in which the internal resistance RINT of the secondary battery pack 200 is represented by the sum of the fixed component RF and the variable component RV. The variable component RV comprises the transient response component RI and the temperature dependent component RT. The internal resistance calculation unit 604 calculates the internal resistance RINT of the secondary battery pack 200 based on the model thus assumed. An acquisition unit 604a calculates the ZBAT1 value, which is the fixed component RF, based on the result of the initial measurement processing described later. An acquisition unit 604b calculates the ZBAT2 value, which is the transient response component RI, based on the history of the current that flows through the secondary battery pack 200. The history of the current is configured using the count value CCNT of the coulomb counter 702. An acquisition unit 604c acquires the temperature dependent component RT based on the temperature T. The history of the current is configured using the count value CCNT of the coulomb counter 702. These resistance components thus calculated are added together by an adder 605, thereby calculating the internal resistance RINT.

The voltage drop calculation unit 606 multiplies the internal resistance RINT by the charging/discharging current IBAT, thereby calculating the voltage drop VDROP.

The open circuit voltage calculation unit 608 adds the voltage drop VDROP to the present battery voltage VBAT, thereby calculating the open circuit voltage OCV of the secondary battery pack.

The first charge state estimation unit 610 acquires the present charge state SOC_ocv that corresponds to the present open circuit voltage OCV, based on the correspondence relation between the OCV and SOC stored in the memory 602.

The second charge state estimation unit 612 calculates the state of charge SOC_cc based on the count value CCNT of the coulomb counter and the battery capacity BATCAP.

When the difference between the two states of charge, i.e., SOC_ocv and SOC_cc, exceeds an allowable value, the coulomb counter correction unit 614 corrects the count value CCNT of the coulomb counter.

Furthermore, when the difference between the two charged states, i.e., SOC_ocv and SCO_cc, exceeds an allowable value, the battery capacity correction unit 616 corrects the battery capacity BATCAP.

The initial resistance calculation unit 620 calculates the initial value ZBAT1_init of the fixed component ZBAT1 of the internal resistance RINT based on the battery voltage VBAT and the load current IBAT obtained as a result of the initial measurement step S102 executed immediately after the presence of the secondary battery pack 200 has been detected.

The aging evaluation unit 622 evaluates the aging degree α of the secondary battery pack 200 based on the initial value ZBAT1_init of the fixed component ZBAT1. The battery capacity correction unit 616 corrects the battery capacity BATCAP in the initial state, based on the aging degree α.

The above constitutes the functional blocks of the power management system 101 configured to detect the remaining capacity. Specific description will be made below regarding the remaining capacity detection operation of the power management system 101.

Figure 6:
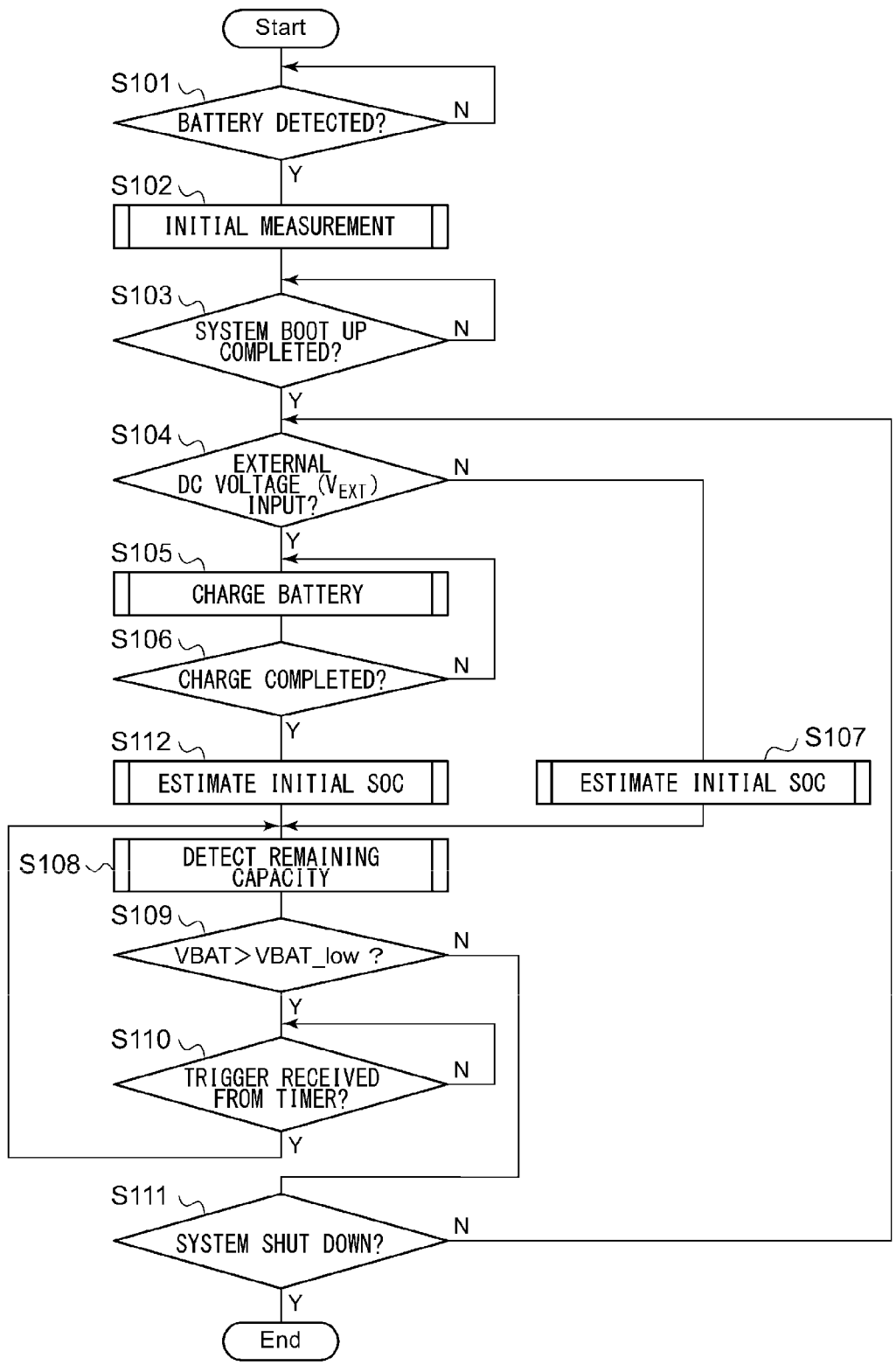
FIG. 6 is a flowchart showing a remaining battery capacity detection operation of the battery management system.
Figure 7:
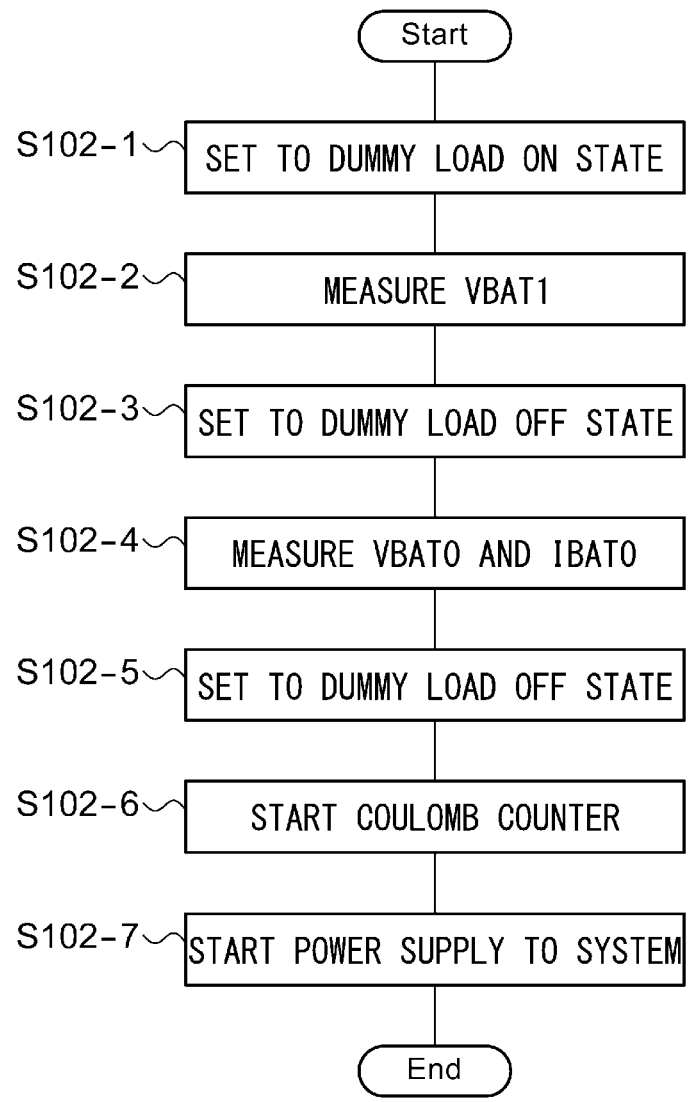
FIG. 7 is a flowchart showing an initial measurement operation shown in FIG. 6.
Figure 8:
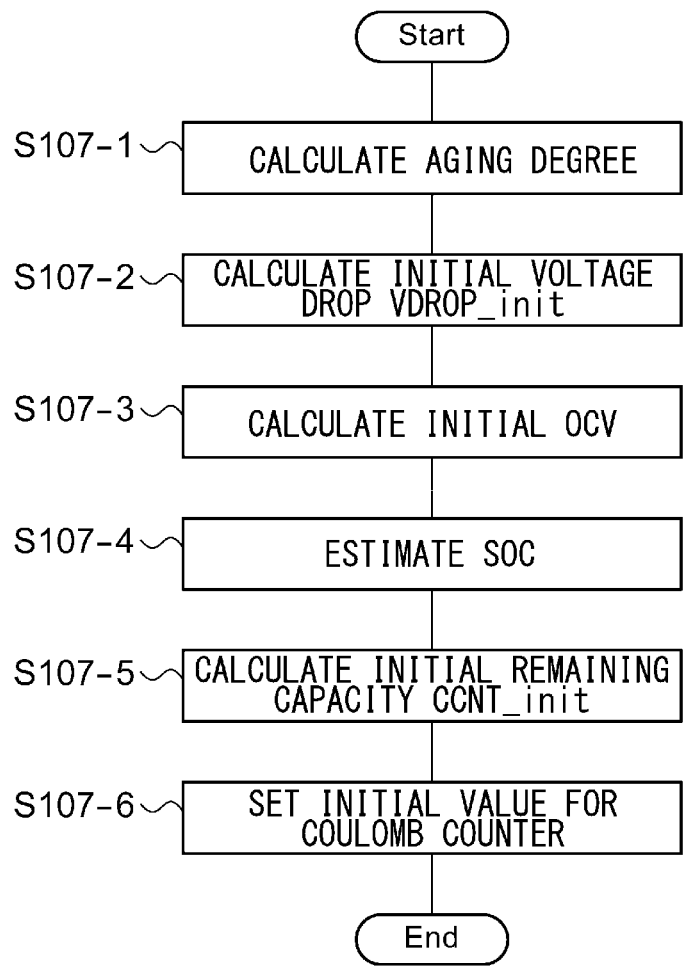
FIG. 8 is a flowchart showing an initial SOC estimation operation shown in FIG. 6.
Figure 9:
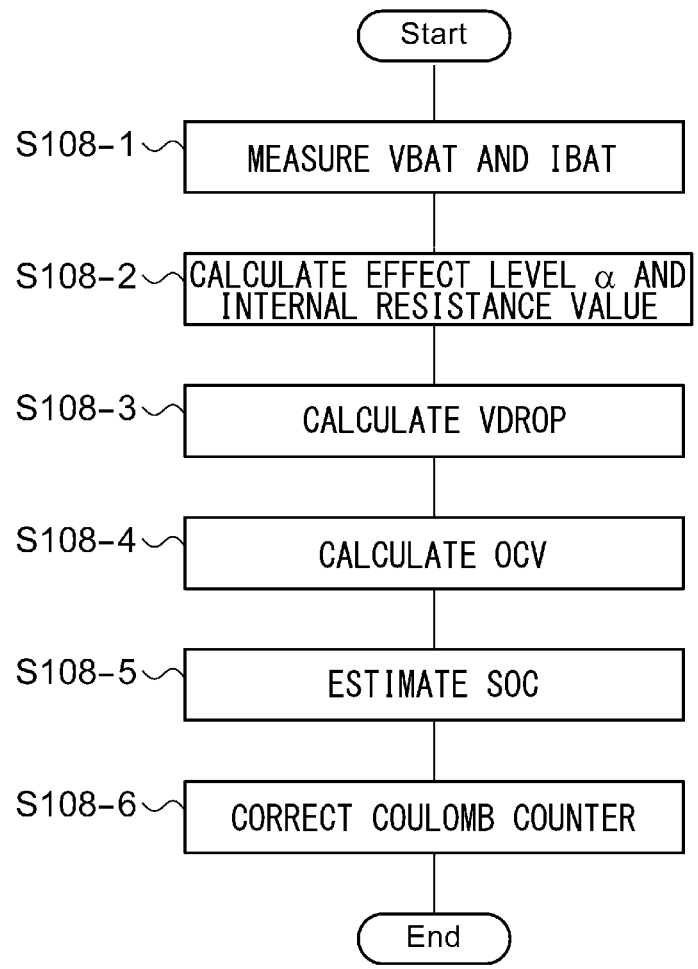
FIG. 9 is a flowchart showing an SOC estimation operation shown in FIG. 6.

FIG. 6 is a flowchart showing a remaining capacity detection operation of the power management system 101. FIG. 7 is a flowchart showing the operation in the initial measurement step S102 shown in FIG. 6. FIG. 8 is a flowchart showing the operation in the initial SOC estimation step S107 shown in FIG. 6. FIG. 9 is a flowchart showing the operation in the remaining capacity estimation step S108 shown in FIG. 6.

Referring to FIG. 6, the battery monitoring unit 304 shown in FIG. 3 judges the presence of absence of the secondary battery pack 200 (S101). The presence or absence of the secondary battery pack 200 can be judged based on the terminal voltage $V_T$ of the thermistor 206 configured to measure the temperature. Also, the presence or absence of the secondary battery pack 200 can be detected based on the battery response that occurs when a known load is connected to the battery. When the presence of the secondary battery pack 200 is not detected (NO in S101), the battery monitoring unit 304 repeats the detection operation for detecting the presence or absence of the secondary battery pack 200.

When the presence of the secondary battery pack 200 is detected (YES in S101), the initial measurement processing is performed (S102).

Description will be made regarding the initial measurement step S102 with reference to FIG. 7.

First, the positive electrode terminal 208 of the secondary battery pack 200 is opened, i.e., is set to a no-load state (S102-1). In the no-load state, the battery voltage VBAT1 is measured, and is stored in an internal register (S102-2). Next, a light load (which will be referred to as the "dummy load") having a fixed low resistance is connected between the positive electrode terminal 208 of the secondary battery pack 200 and the ground (GROUND) (S102-3). Immediately after the connection of the dummy load, the battery voltage (VBAT0) and the load current (IBAT0) are measured (S102_4). The measurement values VBAT0 and IBAT0 are stored in the internal register. The dummy load may be configured using a resistor built into the battery management circuit 300. The time point immediately after the connection of the dummy load represents a time point before the effects of the transient response appear.

Next, the dummy load thus connected in Step S102-1 is disconnected (S102-5). After the system controller 400 starts up, the measurement values VBAT0, IBAT0, and VBAT1, stored in the internal register, are read out by the remaining capacity calculation program 408 (remaining capacity detection unit 600), and are used to perform the initial SOC estimation processing (S107 described later) for the secondary battery pack 200.

Immediately after the measurement of the voltage and current ends, the coulomb counter 308 starts to operate (S102-6). It should be noted that the initial value of the battery capacity BATCAP is a provisional value. That is to say, the battery capacity BATCAP cannot be determined with high precision until the subsequent initial settings are made. In contrast, the relative value of the remaining capacity, which changes over time (difference over time), can be determined with high precision.

Next, the power FET 108 shown in FIG. 3 is turned on. In this state, the secondary battery pack 200 starts to supply the battery voltage VBAT to the power management circuit 500 configured as a system load (S102-7).

The above is the operation in the initial measurement step S102.

Description will be made returning to FIG. 6. After the initial measurement processing (S102) is completed, the electronic device waits for the startup operation of the system controller 400 (NO in S103). After the startup operation of the system controller 400 (YES in S103), the state transits to a state in which the main processor 402 can execute the remaining capacity calculation program 408 under the management of the operating system 404.

When the secondary battery pack 200 has a sufficient remaining capacity, it is needless to say that the system controller 400 can start up. Even if the secondary battery pack 200 has an insufficient remaining capacity, if electric power is supplied to the system controller 400 from an external power supply connected to a DC power input terminal 102 in a predetermined manner, such an arrangement allows the system controller 400 to start up.

Next, the battery management circuit 300 judges the presence or absence of the external DC voltage VEXT from an external power supply (S104). Specifically, the battery management circuit 300 includes a comparator (not shown in FIG. 3) which compares the external DC voltage VEXT with a predetermined threshold value. The presence or absence of the external DC voltage VEXT is judged by means of the comparator thus arranged. When the external DC voltage VEXT having an effective voltage level is input (YES in S104), and when the secondary battery pack 200 has not reached the full charge state, the charging circuit 302 starts the supply of charging power to the secondary battery pack 200 (S105). The charging method employed in the charging circuit 302 is not restricted in particular. Rather, known or prospectively available methods may be employed. The charging operation (S105) is continued until the battery voltage VBAT reaches the charge end voltage VCHG_term (NO in S106). When the battery voltage VBAT reaches the charge end voltage VCHG_term (YES in S106), the charging operation ends.

Next, in S107, the initial SOC estimation processing is executed for the secondary battery pack 200. The initial SOC estimation processing in S107 is executed by the system controller 400 according to the remaining capacity calculation program 408.

There is a difference in the operation in the initial SOC estimation step S107 between a case (YES in S106) in which the battery voltage VBAT has reached the charge end voltage as a result of the charging and a case (NO in S104) in which the charging has not been completed.

Description will be made regarding the initial SOC estimation processing in S112 in a case in which the charging has been completed after the charge end voltage VCHG_term has been reached.

In the initial SOC estimation step S112, the count value CCNT of the coulomb counter is initialized based on the charge end voltage VCHG_term. When the charge end voltage VCHG_term matches the maximum charge state voltage defined by the secondary battery specifications, i.e., the full charge state voltage (e.g., 4.3 V if the battery is configured as a lithium-ion battery), the count value of the coulomb counter 308 is set to the same value as that of the battery capacity BATCAP.

That is to say, in this case, the SOC value (=CCNT÷BATCAP×100 [%]) calculated based on the count value CCNT of the coulomb counter is 100%. In some cases, the charge end voltage VCHG_term is set to a voltage value (e.g., 4.2 V) that is lower than the maximum charge voltage, giving consideration to the system requirements, the battery life, or the like. In this case, the battery capacity BATCAP is reduced as represented by the following Expression (1) with an operation stop voltage VBAT_low as a reference.

$$BATCAP=BATCAP\_max \times (VCHG\_term-VBAT\_low)/(VBAT\_max-VBAT\_low) \quad (1)$$

Here, BATCAP_max represents the maximum capacity of the battery, VCHG_term represents the charge end voltage, VBAT_max represents the maximum voltage (rated value) of the battery, and the VBAT_low represents the operation stop voltage. Examples of the maximum capacity of the battery BATCAP_max to be employed include: the rated capacity of the secondary battery pack 200; and a measurement value obtained beforehand by measuring a sample battery. In a case in which the battery is aging as described later, the battery capacity BATCAP is further corrected according to the aging degree of the battery.

Here, the operation stop voltage VBAT_low by no means represents the "discharge stop voltage" defined by JIS C8711. Rather, the operation stop voltage VBAT_low is set such that, when the system is shut down, it secures a sufficient operating voltage and sufficient remaining capacity required for the operating system to execute a shutdown operation normally (saving necessary data in a nonvolatile storage medium, etc.) according to the system requirements.

Description will be made regarding the initial SOC estimation processing in S107 when the charging operation has not been completed (NO in S104). When the DC power has not been input after the battery pack has been mounted, the charging operation is not performed, and the state of charge (SOC) of the battery and the remaining capacity are unknown. Description will be made with reference to FIG. 8 regarding the initial SOC estimation processing executed in this case in S107.

In the initial SOC estimation processing in S107 shown in FIG. 8, an equivalent circuit model of the internal resistance shown in FIG. 4A is used.

First, the aging degree α of the secondary battery is calculated (S107-1). The aging degree α is calculated using the measurement values VBAT0, IBAT0, and VBAT1 stored in the internal register, which have been measured in the aforementioned initial measurement processing (S102 in FIG. 7) when the battery is mounted. In the waveform diagram shown in FIG. 4B, the VBAT1 corresponds to the battery voltage VBAT that develops before the time point t0, VBAT0 corresponds to the battery voltage VBAT that develops immediately after the time point t0, and IBAT0 corresponds to the current value of the load current IBAT that flows immediately after the time point t0.

It should be noted that the VBAT1 acquired in the initial measurement step S102 does not necessarily match the OCV of the secondary battery. This is because, in a case in which a sufficient relaxation time has not elapsed after the secondary battery pack 200 is used, i.e., is discharged or otherwise charged, the battery voltage VBAT does not match OCV.

Next, the initial value ZBAT1_init of the internal resistance of the secondary battery pack 200 is calculated based on the following Expression (2) using the values thus read out. The term (VBAT1−VBAT0)/IBAT0 substantially does not include the voltage drop that occurs at the variable resistance component RF. Thus, by subtracting the temperature dependent component ZBAT2_pre(T) from the term (VBAT1−VBAT0)/IBAT0, the fixed component RF of the internal resistance is calculated. This processing is executed by the initial resistance calculation unit 620 shown in FIG. 5.

$$ZBAT1\_init=(VBAT1-VBAT0)/IBAT0-ZBAT2\_pre(T) \quad (2)$$

The present inventors have reached a conclusion that aging (cycle aging) of the secondary battery pack 200 due to the repetition of charging/discharging leads to an increase in the fixed component ZBAT1_init calculated based on the current value IBAT and the voltage value VBAT measured in the initial measurement performed immediately after the presence of the secondary battery pack 200 is detected. Thus, the fixed component ZBAT1_pre is measured beforehand for an unused secondary battery pack 200 before aging, and the fixed component ZBAT1_pre thus measured is stored in the memory. The system controller 400 evaluates the aging degree α of the secondary battery pack 200 based on the value ZBAT1_init calculated using Expression (2) and the value ZBAT1_pre measured beforehand. The evaluation of the aging degree α is executed by the aging evaluation unit 622 shown in FIG. 5. The aging degree α is defined by the following Expression (3), for example. The aging degree α becomes larger as the aging advances.

$$\alpha=(ZBAT1\_init-ZBAT1\_pre)/ZBAT1\_pre \quad (3)$$

The aging degree α may be used to manage the battery life.

Furthermore, the present inventors have reached a conclusion that the aging degree α calculated using Expression (3) has a correspondence with a reduction in of the battery capacity of the secondary battery. Thus, with the present embodiment, the battery capacity BATCAP is corrected according to the aging degree α. Specifically, the corrected battery capacity BATCAP' is calculated using Expression BATCAP'=(1−α)×BATCAP. This processing is executed by the battery capacity correction unit 616 shown in FIG. 5.

As described above, with the battery management circuit 300 according to the embodiment, the fixed resistance value RF is measured immediately after the load current IBAT is applied in the initial state, and the aging degree α of the secondary battery pack 200 can be evaluated based on the resistance value thus measured. Furthermore, the battery capacity BATCAP can be corrected according to the aging degree α.

In a case in which the initial measurement values VBAT0, IBAT0, and VBAT1 have not been measured for some reason, as an error handling operation, the battery capacity BATCAP may be set to the rated battery capacity BATCAP_max assuming that the aging degree is zero (i.e., assuming no aging).

Next, the initial value VDROP_init of the voltage drop value VDROP is calculated (S107-2). Specifically, a dummy load is connected to the secondary battery. In this state, the load current IBAT_init and the battery voltage VBAT_init are measured. Next, the initial value VDROP_init of the voltage drop value VDROP is calculated using the following Expression (4) (S107-2).

$$VDROP\_init = IBAT\_init \times (ZBAT1\_init + ZBAT2\_pre(T) + ZBAT3\_pre(CCNTS\_var)) \quad (4)$$

The impedance term $(ZBAT1\_init + ZBAT2\_pre(T) + ZBAT3\_pre(CCNTS\_var))$ is calculated by the internal resistance calculation unit 604 shown in FIG. 5. The voltage drop VDROP_init is calculated by the voltage drop calculation unit 606 shown in FIG. 5.

The initial value OCV_init of the open circuit voltage OCV is estimated based on the following Expression (5) using the initial voltage drop value VDROP_init thus obtained (S107-3). This estimation is performed by the open circuit voltage calculation unit 608.

$$OCV\_init = VBAT\_init + VDROP\_init \quad (5)$$

The system controller 400 is provided with an OCV-SOC table SOC=table(OCV) which represents the correspondence relation between the open circuit voltage OCV and the state of charge SOC. The SOC represents the ratio ([%] in the present embodiment) of the present remaining capacity with the remaining capacity in the full-charge state as a reference.

The system controller 400 estimates the SOC initial value SOC_ocv_init=table(OCV_init) that corresponds to the present estimated open circuit voltage OCV_init with reference to the table (S107-4). This estimation is performed by the first charge state estimation unit 610 shown in FIG. 5.

Furthermore, the initial remaining capacity CCNT_init is calculated according to the following Expression (6) (S107-5). The initial remaining capacity CCNT_init thus calculated is set as the initial value of the coulomb counter (S107-6). Here, BATCAP represents the battery capacity. This processing is executed by the coulomb counter correction unit 614 shown in FIG. 5.

$$CCNT\_init = SOC\_ocv\_init[\%]/100 \times BATCAP \quad (6)$$

In a case in which the secondary battery is aging, the battery capacity BATCAP is corrected according to the aging degree α.

Description will be made returning to FIG. 6. In the steps described above, such an arrangement is capable of estimating the state of charge (SOC) of the battery, i.e., the initial value SOC_ocv_init of the relative remaining battery capacity with respect to the full-charge state, and the initial value of the absolute remaining battery capacity.

The subsequent steps S108, S109, and S110, correspond to the remaining capacity estimation processing during the discharging operation of the battery. The remaining capacity estimation processing in S108 is repeatedly performed at predetermined time intervals (e.g., every several seconds) until the battery voltage becomes lower than the operation stop voltage VBAT_low.

Description will be made with reference to FIG. 9 regarding the remaining capacity estimation processing in S108.

The battery measurement unit 700 measures the present battery voltage VBAT(n) and the discharge current IBAT(n) with predetermined cycles (S108-1). Here, n represents the measurement time point, which is incremented every time the measurement is performed.

The aforementioned effect level CCNTS_var based on the history of variation in the load is calculated using the count value CCNT of the coulomb counter (S108-2). Thus, the coulomb counter count values CCNT measured over a period of the past several minutes are stored at all times. The present effect level CCNTS_var(n) of the history of variation in the load is defined by the following Expression (7).

$$CCNTS\_var(n) = \Sigma_{p=0:m}[\{CCNT(n-p) - CCNT(n-p-1)\} * K\_dec(p)] \quad (7)$$

Here, CCNTS_var represents the effect level of the history of variation in the load, CCNT represents the count value of the coulomb counter, and K_dec represents the decay coefficient which represents the decay due to the passage of time. The reference symbol "n" represents the present time point, "n−1" represents the measurement time point immediately before the present time point, and "n−p" represents the measurement time point p points before the present time point. The symbol "m" represents the number of samples measured in the past to be used to calculate the effect level of the history.

The acquisition unit 604b of the internal resistance calculation unit 604 shown in FIG. 5 calculates the effect level CCNTS_var(n) at each time point n, and acquires the transient response component ZBAT2 based on the calculation result.

The term (CCNT(n−p)−CCNT(n−p−1)) corresponds to a current that flows at the time point that is p time points before the present time point n. K_dec(p) represents the weighting coefficient set for the time point (n−p). For example, in a case in which the coulomb counter count values measured in time intervals of 1 second for the past 2 minutes are stored, the number m of samples of the coulomb counter count values is 120. In this case, in a case in which the coulomb counter is configured as a 32-bit counter, there is a need to prepare a buffer component having a very large buffer capacity, i.e., a 3840-bit buffer. In a case in which such an arrangement is configured as a hardware component, such an arrangement can require a very large register capacity, which is a problem. On the other hand, in a case in which such an arrangement is configured as a software component, such an arrangement can require a very large storage area and calculation amount, which is also a problem. In order to solve such a problem, the coulomb counter count values discretely measured in time intervals on the order of 10 seconds are stored in the register such that it requires only m=10 samples to be stored in the buffer. Typically, the decay coefficient K_dec that depends on the passage of time also depends on the battery transient response, and it is difficult to represent the decay curve using a simple expression. The decay calculation is preferably simplified assuming that the decay can be represented by a simple exponential expression using exponents of 2. This is because the calculation of exponents of 2 can be executed by bit shifting. For example, the decay coefficient K_dec(p) p time points before the present time point n is defined by the following Expression.

$$K\_dec(p) = 2^{-p}$$

It has been confirmed by experiment that such simplification of the decay coefficient does not lead to an increase in error. It can be assumed that, even if the calculation is simplified, such a simple calculation allows calculation error to be greatly reduced because the effect of the history of variation of the load is very great.

Typically, the transient response that occurs due to the electrochemical impedance due to the migration and diffusion of the charge and the electrical capacitive impedance due to the electric double layer structure is represented by a decay curve with a long decay time. Strictly, in order to precisely calculate the effect of variation in the load, there is a need to perform integration calculation. By replacing the integration calculation with the aforementioned simple calculation, such an arrangement provides improved estimation precision with high efficiency.

Next, the voltage drop VDROP is calculated based on the following Expression (8) (S108-3).

$$VDROP(n)=IBAT(n)\times(ZBAT1\_pre+ZBAT2\_pre(T)+ZBAT3\_pre(CCNTS\_var(n))) \quad (8)$$

This calculation processing is executed by the voltage drop calculation unit 606 shown in FIG. 5.

Next, the open circuit voltage (OCV) is estimated based on the following Expression (9) (S108-4). This processing is executed by the open circuit voltage calculation unit 608 shown in FIG. 5.

$$OCV(n)=VBAT(n)+VDROP(n) \quad (9)$$

Next, the estimated value SOC_ocv of the state of charge (SOC) is obtained with reference to the table (S108-4). This processing is executed by the first charge state estimation unit 610 shown in FIG. 5.

Here, IBAT(n), VBAT(n), and VDROP(n) represent the current value, voltage value, and voltage drop value at the present time point (n), respectively. Furthermore, OCV(n) represents the present estimated open circuit voltage OCV.

Also, the SOC can be calculated based on the coulomb counter count value CCNT and the battery capacity (rated battery capacity or otherwise effective battery capacity) BATCAP. This processing is executed by the second charge state estimation unit 612 shown in FIG. 5.

$$SOC\_cc(n)[\%]=CCNT(n)/BATCAP \quad (10)$$

Here, it is inherently possible for there to be an error in the battery capacity BATCAP that occurs in the calculation of the initial estimated value of the battery capacity BATCAP. In a case in which the battery starts to discharge immediately after the battery has been fully charged, the voltage drop becomes large, leading to a tendency for the error to become large. Also, in a case in which the state of charge of the battery having an unknown remaining capacity is estimated so as to calculate the initial values, it is inherently possible for there to be an error in the battery capacity BATCAP that occurs in the measurement of the initial value of the SOC and in the estimation of the aging degree.

In order to solve such a problem, when there is a difference between the SOC value SOC_ocv derived by means of the open circuit voltage estimation and the SOC value SOC_cc derived based on the coulomb counter count value, a correction operation may be made in which the coulomb counter count value is adjusted assuming that there is an error in the initial value of the coulomb counter count value. For example, when (SOC_cc−SOC_ocv)>5%, an amount of charge that corresponds to a predetermined ratio with respect to the rated battery capacity (e.g., 1%) may be subtracted from the coulomb counter count value. This processing is executed by the coulomb counter correction unit 614 shown in FIG. 5.

In this case, in order to maintain the continuity of the SOC_cc, the same amount of charge is preferably subtracted from the battery capacity BATCAP. This processing is executed by the battery capacity correction unit 616 shown in FIG. 5. This allows an error that has occurred in the initial value estimation due to aging of the battery or the like to be corrected in an adaptive manner in the subsequent step. It should be noted that the relative value of the coulomb counter is precise. Thus, such error correction has no effect on the calculation of the history of variation in the load. Furthermore, the absolute value of the coulomb counter is corrected. Thus, such an arrangement allows the absolute value of the remaining capacity (in [mAh] units) to be acquired, in addition to the SOC value.

The above is the estimation calculation method for estimating the state of charge (SOC) of the battery and the remaining battery capacity by means of the battery management circuit 300 and the system controller 400 according to the embodiment.

This method provides the following advantages.

First, a part of the function block of the battery monitoring unit 304 may also be used as the dummy load when a load current is temporarily applied to the battery in the measurement of the initial state of the battery (S102). For example, the battery monitoring unit 304 has a function of detecting the connection of the battery. The circuit component used for this function may be employed as such a dummy load.

Second, the initial state is measured (S102) every time the secondary battery pack 200 is mounted in an unknown charge state. Thus, such an arrangement requires no nonvolatile memory to store the charge state of the battery.

Third, the calculation is performed using both the voltage method and the charge integration method. Furthermore, mutual error correction is performed between these calculation results. This allows the remaining capacity to be detected with higher precision as compared with conventional techniques.

Fourth, when the electronic device 100 is in a suspended state, only the integration of the amount of charge is performed by the coulomb counter 308, and the open circuit voltage (OCV) estimation is suspended, thereby allowing power consumption to be reduced. Thus, the open circuit voltage estimation calculation processing (S108) may be executed only in the normal operation of the electronic device 100. This allows the open circuit voltage estimation calculation component to be configured as software. This means that the hardware component of the battery management circuit 300 can be reduced. It should be noted that, when the electronic device 100 is in a suspended state, the operation of the first A/D converter 310 may be suspended. Such an arrangement provides reduced power consumption.

Fifth, such an arrangement does not use an equivalent circuit model to calculate the internal resistance RINT of the battery. Instead, the internal resistance RINT is calculated based on the sum of the fixed component RF and the variable component RV. Such an arrangement eliminates complicated calculation, and allows the calculation amount to be reduced. This allows the processing time and consumed power to be reduced.

Sixth, the variable component of the internal resistance value RINT of the battery is calculated giving consideration to the temperature of the battery, variation in the load, variation of the battery characteristics, and aging of the battery. Thus, such an arrangement allows the estimation error to be reduced.

Seventh, when the device is started up or when a battery is mounted, the state of charge (SOC) of the battery and the remaining capacity are estimated. Thus, such an arrangement does not require a nonvolatile storage medium (flash memory or the like) for storing and holding the state of the battery when the system is shut down.

Eighth, when the battery is charged, the remaining capacity estimation apparatus and the charging circuit for the battery operate in a cooperative manner. Thus, such an arrangement is capable of immediately notifying the remaining capacity estimation apparatus of the full-charge completion time point without a software function or other kinds of communication functions. Furthermore, a part of the functions of the charging circuit (charge current supply function and no-load state/constant-load state selection function) may also be used to measure the initial state of the battery. Such an arrangement allows redundant hardware components to be omitted.

Description has been made regarding the present invention with reference to the embodiments. The above-described embodiments have been described for exemplary purposes only, and are by no means intended to be interpreted restrictively. Rather, various modifications may be made for each component, each process, and various kinds of combinations of them. Description will be made regarding such modifications.

Description has been made in the embodiment regarding an arrangement in which the remaining capacity estimation is performed using a combination of the battery management circuit 300 and the system controller 400 shown in FIG. 3, as described with reference to FIGS. 6 through 9. However, the present invention is not restricted to such an arrangement.

Figure 1A:
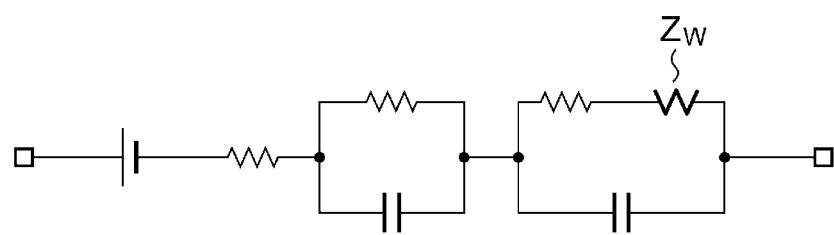
FIGS. 1A and 1B are diagrams each showing an equivalent circuit model of a battery.
Figure 1B:
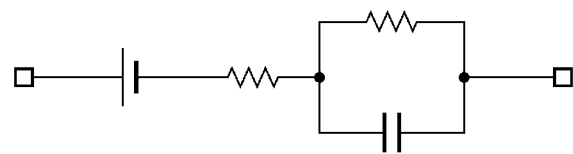
Figure 2:
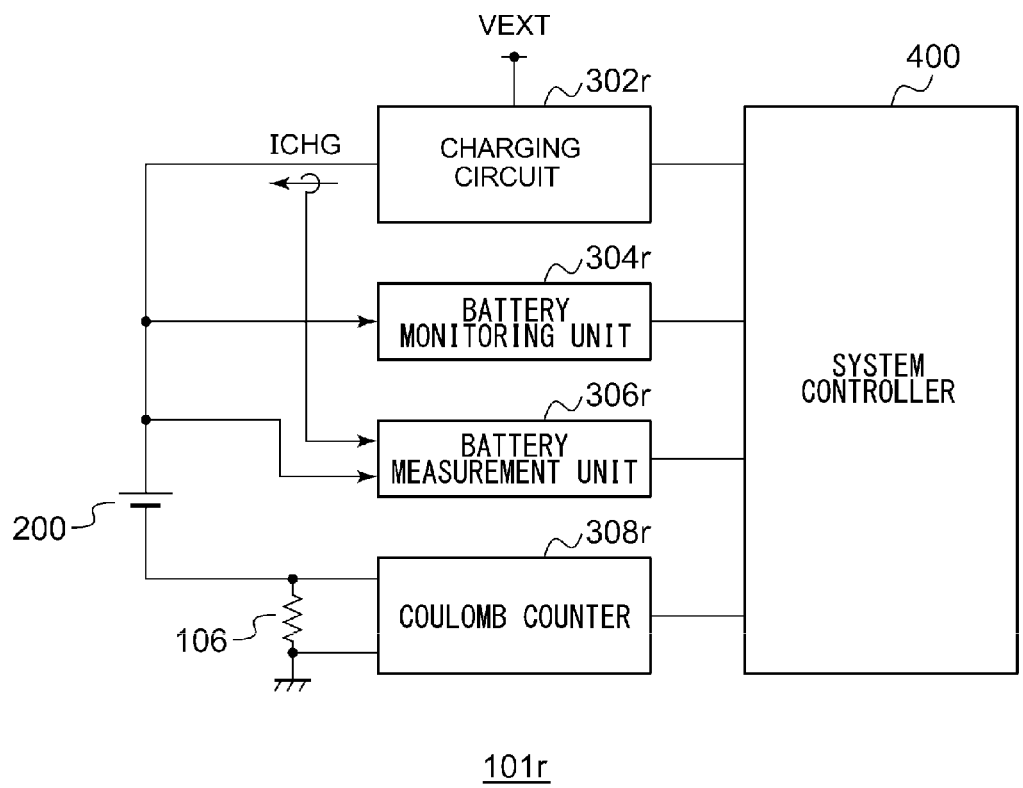
FIG. 2 is a block diagram showing a power management system according to a comparison technique investigated by the present inventors.

For example, the power management system 101r shown in FIG. 2 may perform the remaining capacity estimation processing described with reference to FIGS. 6 through 9.

All the calculation components shown in FIGS. 6 through 9 are not necessarily required. Also, a part of the calculation components shown in FIGS. 6 through 9 may be employed, and the other part of the calculation components may be configured using known techniques.

Description has been made in the embodiment regarding an arrangement in which the system controller 400 is configured using a combination of the main processor 402 and the software component. However, the present invention is not restricted to such an arrangement. Also, the system controller 400 may be configured using only a hardware component. Also, among the functions of the system controller 400, a part of or otherwise all of the functions for detecting the remaining capacity of the secondary battery may be configured as built-in components of the battery management circuit 300.

Conversely, a part of the processing performed by the battery management circuit 300, e.g., the integration processing performed by the coulomb counter 308, may also be performed by the system controller 400. Alternatively, a part of the calculation processing performed by the battery measurement unit 306 may also be performed by the system controller 400.

While the preferred embodiments of the present invention have been described using specific terms, such description is for illustrative purposes only, and it is to be understood that changes and variations may be made without departing from the spirit or scope of the appended claims.

What is claimed is:

1. A method for managing a detachable secondary battery pack in an electronic device comprising a battery monitoring unit and a processor, the method comprising:
   measuring beforehand an internal resistance value of the secondary battery pack before it ages, and holding the measured value in a memory storing a reference internal resistance $ZBAT\_pre$, wherein the reference internal resistance $ZBAT\_pre$ is the internal resistance value of the secondary battery pack measured beforehand;
   monitoring, with the battery monitoring unit, whether the secondary battery pack is coupled to the electronic device;
   in response to the secondary battery pack being coupled to the electronic device, measuring, with the battery monitoring unit, a battery voltage $VBAT1$ in a state in which no load is connected to the secondary battery pack;
   connecting a dummy load to the secondary batter back;
   in response to the secondary battery pack being coupled to the electronic device and in response to the dummy load being connected to the secondary battery pack, measuring, with the battery monitoring unit, a battery voltage $VBAT0$ and a load current $IBAT0$;
   calculating, with the processor, an initial internal resistance value $ZBAT\_init$ of the secondary battery pack based on an expression $ZBAT\_init=(VBAT1-VBAT0)/IBAT0$; and
   calculating, with the processor, the aging degree at of the secondary battery based on a relation between the initial internal resistance value $ZBAT\_init$ and a reference internal resistance value $ZBAT\_pre$.

2. The method according to claim 1, further comprising removing a temperature dependent term for each of the initial internal resistance value $ZBAT\_init$ and the reference internal resistance value $ZBAT\_pre$ in a case in which the internal resistance value has temperature dependence.

3. The method according to claim 1, wherein the aging degree is given by the following expression: $\alpha=(ZBAT\_init-ZBAT\_pre)/ZBAT\_pre$.

4. The method according to claim 1, further comprising correcting a battery capacity $BATCAP$ of the secondary battery pack based on the aging degree.

5. The method according to claim 4, wherein the correcting comprises multiplying the battery capacity $BATCAP$ of the secondary battery by $(1-\alpha)$.

6. A power management system for use in an electronic device, the power management system comprising:
   a detachable secondary battery pack;
   a battery measurement unit configured to:
      detect whether the secondary battery is coupled or detached;
      measure a battery voltage $VBAT$ of the secondary battery pack and a charge/discharge current $IBAT$;
      measure a battery voltage $VBAT1$ in response to the secondary battery pack being coupled with the electronic device and in response to a state in which no load is connected to the secondary battery pack;
      connect a dummy load to the secondary battery pack, measure a battery voltage $VBAT0$ and a load current $IBAT0$ in response to the secondary battery pack being coupled with the electronic device and in response to a state in which the dummy load is connected to the secondary battery back;
   an initial resistance calculation unit configured to calculate an initial value $ZBAT\_init$ of the internal resistance of the secondary battery pack based on the expression $ZBAT\_init=(VBAT1-VBAT0)/IBAT0$; and
   an aging evaluation unit configured to:
      hold a reference value $ZBAT\_pre$ of the internal resistance acquired before the battery back aged; and
      calculate an aging degree of the secondary battery pack based on a relation between the initial value $ZBAT\_init$ and the reference value $ZBAT\_pre$.

7. The power management system according to claim 6, wherein, in a case in which the internal resistance value has temperature dependence, a temperature dependent term is canceled out for each of the initial value ZBAT_init and the reference value ZBAT_pre.

8. The power management system according to claim 6, wherein the aging evaluation unit is configured to calculate the aging degree α based on the expression α=(ZBAT_init−ZBAT_pre)/ZBAT_pre.

9. The power management system according to claim 6, further comprising a battery capacity correction unit configured to correct a battery capacity BATCAP of the secondary battery pack based on the aging degree.

10. The power management system according to claim 9, wherein the battery capacity correction unit is configured to multiply the battery capacity BATCAP by (1−α).

11. An electronic device comprising the power management system according to claim 6.

12. A method for managing a secondary battery pack wherein a model of the secondary battery pack is made assuming that its internal resistance RINT is represented by the sum of a fixed component RF and a variable component RV, and wherein a correspondence relation between a state of charge SOC which indicates a relative remaining capacity with respect to a full-charge state of the secondary battery pack and an open circuit voltage OCV of the secondary battery pack is acquired beforehand, and wherein the method comprises:
  measuring a voltage drop across a current detection resistor in series with a battery cell of the secondary battery pack;
  generating a current detection value indicative of a charge/discharge current IBAT by A/D converting the voltage drop across the current detection resistor;
  generating a battery voltage value indicative of a battery voltage VBAT by A/D converting a battery voltage of the secondary battery pack;
  calculating, with a processor, the variable component RV;
  calculating, with the processor, the internal resistance RINT based on the expression RINT=RF+RV;
  calculating, with the processor, a voltage drop VDROP by multiplying the internal resistance RINT by the current detection value;
  calculating, with the processor, the open circuit voltage OCV of the secondary battery back by adding the voltage drop VDROP to the battery voltage value; and
  calculating a present state of charge SOC_ocv corresponding to the present open circuit voltage OCV based on the correspondence relation.

13. The method according to claim 12, wherein the variable component RV comprises a temperature dependent component $R_T$ and a transient response component $R_I$ of the charge/discharge current,
  and wherein the transient response component $R_I$ at a given time point is defined assuming that it has a value that corresponds to an effect level calculated from a history of the charge/discharge current IBAT that has already flowed.

14. The method according to claim 13, wherein the effect level is calculated by a weighted calculation of the charge/discharge current IBAT measured in the past from the given time point over a predetermined period of time.

15. The method according to claim 14, further comprising integrating the charge/discharge current at predetermined time intervals by means of a coulomb counter,
  wherein the effect level is calculated using the coulomb counter count value.

16. The method according to claim 15, wherein the effect level CCNTS_var(n) at a discrete n-th time point is calculated using CCNTS_var(n)=$\Sigma_{p=0:m}$[{CCNT(n−p)−CCNT(n−p−1)}*K_dec(p)], where CCNT represents the coulomb counter count value, K_dec represents a decay coefficient due to the passage of time, m represents the number of past samples to be used to calculate the effect level of the history, and (n−p) represents a time point p time points before the present time point n.

17. The method according to claim 16, wherein the decay coefficient K_dec(p) is defined as an exponential decay K_dec(p)=$2^{-p}$.

18. The method according to claim 15, further comprising calculating charge state SOC_cc(n) according to SOC_cc(n)=CCNT(n)/BATCAP, with the coulomb counter count value as CCNT(n), and with the battery capacity as BATCAP.

19. The method according to claim 18, further comprising correcting the coulomb counter count value when the difference between the two states of charge SOC_ocv and SOC_cc is greater than an allowable value.

20. The method according to claim 19, wherein, the correcting comprises multiplying the coulomb counter count value by a predetermined coefficient when a relative difference between the two states of charge SOC_ocv and SOC_cc is greater than a predetermined threshold value.

21. The method according to claim 20, wherein, the correcting comprises multiplying the battery capacity BATCAP by the predetermined coefficient when a relative difference between the two states of charge SOC_ocv and SOC_cc is greater than a predetermined threshold value.

22. A power management system comprising:
  a secondary battery pack;
  a battery measurement unit configured to measure a battery voltage VBAT of the secondary battery pack, a charge/discharge current IBAT, and a temperature T; and
  a remaining capacity detection unit configured to calculate a remaining capacity of the secondary battery pack based on the battery voltage VBAT, the charge/discharge current IBAT, and the temperature T,
  wherein an internal resistance RINT of the secondary battery pack is calculated based on a sum of a fixed component RF and a variable component RV,
  and wherein the remaining capacity detection unit comprises:
    an internal resistance calculation unit configured to calculate the internal resistance RINT;
    a voltage drop calculation unit configured to calculate a voltage drop VDROP by multiplying the internal resistance RINT by the charge/discharge current IBAT;
    an open circuit voltage calculation unit configured to calculate an open circuit voltage OCV of the second battery pack by adding the present battery voltage VBAT to the voltage drop VDROP; and
    a first charge state estimation unit configured to acquire a present state of charge SOC_ocv that corresponds to the present open circuit voltage OCV based on a correspondence relation between a state of charge SOC which indicates a relative remaining capacity of the second battery pack with respect to a full-charge state of the secondary battery pack and the open circuit voltage OCV of the secondary battery pack.

23. The power management system according to claim 22, wherein the variable component RV comprises a temperature dependent component $R_T$ and a transient response component $R_I$ of the charge/discharge current, and wherein the transient response component $R_I$ at a given time point is defined assuming that it has a value that corresponds to an effect level calculated by a history of the charge/discharge current IBAT that has already flowed.

24. The power management system according to claim 23, wherein the effect level is defined as a value calculated by a weighted calculation of the charge/discharge current IBAT measured in the past from the given time point over a predetermined period of time.

25. The power management system according to claim 24, further comprising a coulomb counter configured to integrate the charge/discharge current at predetermined time intervals,
and wherein the effect level is defined as a function with the coulomb counter count value as an argument.

26. The power management system according to claim 25, wherein the effect level CCNTS_var(n) at a discrete n-th time point is calculated using CCNTS_var(n)=$\Sigma_{p=0:m}$[{(CCNT(n−p)−CCNT(n−p−1)}*K_dec(p)], where CCNT represents the coulomb counter count value, K_dec represents a decay coefficient due to the passage of time, m represents the number of past samples to be used to calculate the effect level of the history, and (n−p) represents a time point p time points before the present time point n.

27. The power management system according to claim 26, wherein the decay coefficient K_dec(p) is defined as an exponential decay K_dec(p)=$2^{-p}$, using an exponent of 2.

28. The power management system according to claim 25, wherein the remaining capacity detection unit further comprises a second charge state estimation unit configured to calculate the state of charge SOC_cc(n) according to SOC_cc(n)=CCNT(n)/BATCAP, with the coulomb counter count value as CCNT(n), and with the battery capacity as BATCAP.

29. The power management system according to claim 28, wherein the remaining capacity detection unit further comprises a coulomb counter correction unit configured to correct the coulomb counter count value when the difference between the two states of charge SOC_ocv and SOC_cc is greater than an allowable value.

30. The power management system according to claim 29, wherein, when a relative difference between the two states of charge SOC_ocv and SOC_cc is greater than a predetermined threshold value, the coulomb counter correction unit multiplies the coulomb counter count value by a predetermined coefficient.

31. The power management system according to claim 28, wherein the remaining capacity detection unit further comprises a battery capacity correction unit configured to correct the battery capacity BATCAP when a difference between the two states of charge SOC_ocv and SOC_cc is greater than an allowable value.

32. The power management system according to claim 31, wherein, when a relative difference between the two states of charge SOC_ocv and SOC_cc is greater than a predetermined threshold value, the battery capacity correction unit multiplies the battery capacity BATCAP by a predetermined coefficient.

33. An electronic device comprising the power management system according to claim 22.

* * * * *